(12) United States Patent
Sekiguchi et al.

(10) Patent No.: US 8,936,999 B2
(45) Date of Patent: Jan. 20, 2015

(54) MANUFACTURING METHOD OF SOI SUBSTRATE

(75) Inventors: Keiichi Sekiguchi, Isehara (JP); Kazuya Hanaoka, Fujisawa (JP); Daigo Ito, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 119 days.

(21) Appl. No.: 13/341,057

(22) Filed: Dec. 30, 2011

(65) Prior Publication Data

US 2012/0178238 A1 Jul. 12, 2012

(30) Foreign Application Priority Data

Jan. 7, 2011 (JP) ................... 2011-001616

(51) Int. Cl.
*H01L 21/84* (2006.01)
*H01L 21/02* (2006.01)
*H01L 29/786* (2006.01)

(52) U.S. Cl.
CPC ...... *H01L 21/02024* (2013.01); *H01L 21/0206* (2013.01); *H01L 29/78603* (2013.01)
USPC .................. 438/459; 257/E21.568; 438/455

(58) Field of Classification Search
CPC .................................. H01L 21/76254
USPC ................................. 438/455–459
See application file for complete search history.

(56) References Cited

U.S. PATENT DOCUMENTS

| | | | |
|---|---|---|---|
| 5,374,564 A | 12/1994 | Bruel | |
| 5,744,401 A * | 4/1998 | Shirai et al. | ............ 438/693 |
| 6,013,563 A | 1/2000 | Henley et al. | |
| 6,127,702 A | 10/2000 | Yamazaki et al. | |
| 6,242,320 B1 | 6/2001 | So | |
| 6,271,101 B1 | 8/2001 | Fukunaga | |
| 6,312,797 B1 | 11/2001 | Yokokawa et al. | |
| 6,335,231 B1 | 1/2002 | Yamazaki et al. | |
| 6,372,609 B1 * | 4/2002 | Aga et al. | ............ 438/459 |

(Continued)

FOREIGN PATENT DOCUMENTS

| | | |
|---|---|---|
| JP | 2000-124092 | 4/2000 |
| JP | 2002-170942 | 6/2002 |

OTHER PUBLICATIONS http://en.wikipedia.org/wiki/Surface_roughness, downloaded Jun. 18, 2013, Wikipedia Foundation, available under Creative Commons Attribution-ShareAlike License.*

*Primary Examiner* — Steven J Fulk
*Assistant Examiner* — Eric Ward
(74) *Attorney, Agent, or Firm* — Eric J. Robinson; Robinson Intellectual Property Law Office, P.C.

(57) ABSTRACT

An SOI substrate including a semiconductor layer whose thickness is even is provided. According to a method for manufacturing the SOI substrate, the semiconductor layer is formed over a base substrate. In the method, a first surface of a semiconductor substrate is polished to be planarized; a second surface of the semiconductor substrate which is opposite to the first surface is irradiated with ions, so that an embrittled region is formed in the semiconductor substrate; the second surface is attached to the base substrate, so that the semiconductor substrate is attached to the base substrate; and separation in the embrittled region is performed. The value of $3\sigma$ ($\sigma$ denotes a standard deviation of thickness of the semiconductor layer) is less than or equal to 1.5 nm.

12 Claims, 8 Drawing Sheets

(56) References Cited

U.S. PATENT DOCUMENTS

| | | | | |
|---|---|---|---|---|
| 6,380,046 | B1 | 4/2002 | Yamazaki | |
| 6,388,652 | B1 | 5/2002 | Yamazaki et al. | |
| 6,451,672 | B1 * | 9/2002 | Caruso et al. | 438/471 |
| 6,465,328 | B1 * | 10/2002 | Hashii et al. | 438/459 |
| 6,468,923 | B1 | 10/2002 | Yonehara et al. | |
| 6,583,440 | B2 | 6/2003 | Yasukawa | |
| 6,602,761 | B2 | 8/2003 | Fukunaga | |
| 6,686,623 | B2 | 2/2004 | Yamazaki | |
| 6,778,164 | B2 | 8/2004 | Yamazaki et al. | |
| 6,803,264 | B2 | 10/2004 | Yamazaki et al. | |
| 6,818,921 | B2 | 11/2004 | Yasukawa | |
| 6,875,633 | B2 | 4/2005 | Fukunaga | |
| 6,908,797 | B2 | 6/2005 | Takano | |
| 7,112,514 | B2 | 9/2006 | Yasukawa | |
| 7,119,365 | B2 | 10/2006 | Takafuji et al. | |
| RE39,484 | E | 2/2007 | Bruel | |
| 7,176,525 | B2 | 2/2007 | Fukunaga | |
| 7,176,528 | B2 | 2/2007 | Couillard et al. | |
| 7,192,844 | B2 | 3/2007 | Couillard et al. | |
| 7,199,024 | B2 | 4/2007 | Yamazaki | |
| 7,256,776 | B2 | 8/2007 | Yamazaki et al. | |
| 7,399,681 | B2 | 7/2008 | Couillard et al. | |
| 7,476,940 | B2 | 1/2009 | Couillard et al. | |
| 7,508,034 | B2 | 3/2009 | Takafuji et al. | |
| 7,514,341 | B2 * | 4/2009 | Neyret et al. | 438/459 |
| 7,605,053 | B2 | 10/2009 | Couillard et al. | |
| 7,619,250 | B2 | 11/2009 | Takafuji et al. | |
| 7,632,739 | B2 | 12/2009 | Hebras | |
| 7,635,617 | B2 | 12/2009 | Yamazaki | |
| 7,755,113 | B2 | 7/2010 | Yamazaki et al. | |
| 7,790,570 | B2 | 9/2010 | Yamazaki | |
| 7,816,736 | B2 | 10/2010 | Yamazaki | |
| 7,834,398 | B2 | 11/2010 | Yamazaki | |
| 7,838,935 | B2 | 11/2010 | Couillard et al. | |
| 7,867,873 | B2 | 1/2011 | Murakami et al. | |
| 8,034,694 | B2 | 10/2011 | Ohnuma et al. | |
| 8,088,669 | B2 | 1/2012 | Yamazaki | |
| 8,440,541 | B2 * | 5/2013 | Pitney et al. | 438/455 |
| 8,575,722 | B2 * | 11/2013 | Mitani et al. | 257/618 |
| 2002/0109144 | A1 | 8/2002 | Yamazaki | |
| 2002/0187619 | A1 * | 12/2002 | Kleinhenz et al. | 438/471 |
| 2003/0183876 | A1 | 10/2003 | Takafuji et al. | |
| 2004/0061176 | A1 | 4/2004 | Takafuji et al. | |
| 2004/0104424 | A1 | 6/2004 | Yamazaki | |
| 2005/0009252 | A1 | 1/2005 | Yamazaki et al. | |
| 2005/0260800 | A1 | 11/2005 | Takano | |
| 2006/0038228 | A1 | 2/2006 | Aitken et al. | |
| 2006/0099773 | A1 | 5/2006 | Maa et al. | |
| 2006/0110899 | A1 | 5/2006 | Bourdelle et al. | |
| 2007/0020947 | A1 | 1/2007 | Daval et al. | |
| 2007/0063281 | A1 | 3/2007 | Takafuji et al. | |
| 2007/0087488 | A1 | 4/2007 | Moriwaka | |
| 2007/0108510 | A1 | 5/2007 | Fukunaga | |
| 2007/0173000 | A1 | 7/2007 | Yamazaki | |
| 2007/0184632 | A1 | 8/2007 | Yamazaki et al. | |
| 2007/0291022 | A1 | 12/2007 | Yamazaki et al. | |
| 2008/0061301 | A1 | 3/2008 | Yamazaki | |
| 2008/0067529 | A1 | 3/2008 | Yamazaki | |
| 2008/0124929 | A1 * | 5/2008 | Okuda et al. | 438/692 |
| 2008/0171443 | A1 | 7/2008 | Hebras | |
| 2008/0213953 | A1 | 9/2008 | Yamazaki | |
| 2008/0248629 | A1 | 10/2008 | Yamazaki | |
| 2008/0286941 | A1 | 11/2008 | Yamazaki | |
| 2008/0286942 | A1 | 11/2008 | Yamazaki | |
| 2009/0023267 | A1 | 1/2009 | Daval et al. | |
| 2009/0023271 | A1 | 1/2009 | Couillard et al. | |
| 2009/0095956 | A1 | 4/2009 | Takafuji et al. | |
| 2009/0117706 | A1 * | 5/2009 | Soeta et al. | 438/458 |
| 2010/0019242 | A1 | 1/2010 | Takafuji et al. | |
| 2010/0173472 | A1 * | 7/2010 | Nagano | 438/458 |
| 2010/0297828 | A1 * | 11/2010 | Maleville | 438/458 |

* cited by examiner

MANUFACTURING METHOD OF SOI SUBSTRATE

BACKGROUND OF THE INVENTION

1. Field of the Invention

One embodiment of the present invention relates to a method for manufacturing an SOI substrate.

2. Description of the Related Art

In recent years, an integrated circuit using an SOI (silicon on insulator) substrate in which a thin single crystal semiconductor layer exists on an insulating surface, instead of a bulk silicon wafer has been developed. The use of an SOI substrate leads to a reduction in the parasitic capacitance between a drain of a transistor and the substrate; thus, SOI substrates have attracted attention for their ability to improve performance of semiconductor integrated circuits.

One of known methods for manufacturing an SOI substrate is a hydrogen ion implantation separation method (for example, see Patent Document 1). A method for manufacturing an SOI substrate according to a hydrogen ion implantation separation method is summarized below. First, hydrogen ions are implanted into one silicon wafer by an ion implantation method to form a microbubble layer in the region at a certain depth from a top surface of the silicon wafer. Next, the silicon wafer is bonded to the other silicon wafer with a silicon oxide film provided therebetween. Then, heat treatment is performed thereon, so that a part of the one silicon wafer is separated in a thin film shape along the microbubble layer serving as a cleavage plane. Accordingly, a single crystal silicon film can be formed over the other silicon wafer.

Further, a method for forming a single crystal silicon layer over a base substrate made of glass according to such a hydrogen ion implantation separation method has been proposed (for example, see Patent Document 2). Glass substrates are more suitable for an increase in area and are less expensive than silicon wafers; thus, an SOI substrate which has a large area and is inexpensive can be manufactured by using the glass substrate as a base substrate.

Further, in Patent Document 2, it is proposed that a silicon nitride film is provided between a base substrate and a single crystal silicon layer so as to prevent impurities in the base substrate or the like from diffusing into the single crystal silicon layer.

A single crystal semiconductor substrate is irradiated with accelerated hydrogen ions, whereby the hydrogen ions are implanted or doped into the single crystal semiconductor substrate at a certain depth from a top surface thereof, so that an embrittled region is formed. Then, heat treatment is performed thereon, whereby hydrogen contained in the embrittled region is vaporized and expanded, so that a cleavage plane is formed in the embrittled region.

REFERENCE

Patent Document 1: Japanese Published Patent Application No. 2000-124092
Patent Document 2: Japanese Published Patent Application No. 2002-170942.

SUMMARY OF THE INVENTION

However, according to the above-described hydrogen ion implantation separation method, the thickness of the single crystal semiconductor layer is uneven in some cases despite the same condition of hydrogen ion implantation and separation.

Unevenness in the thickness of the single crystal semiconductor layer may adversely affects the subsequent manufacturing process or the reliability of a semiconductor element formed using the single crystal semiconductor layer.

In view of the forgoing, one object of one embodiment of the present invention is to provide an SOI substrate including a semiconductor layer whose thickness is even.

According to one embodiment of the present invention, before irradiating a semiconductor substrate with ions, a rear surface of the semiconductor substrate which is opposite to a surface of the same irradiated with the ions is polished to be planarized.

Irradiation of a semiconductor substrate with ions generates heat to increase the temperature of the semiconductor substrate. However, part of the generated heat is released through a rear surface of the semiconductor substrate which is opposite to a surface of the same irradiated with the ions. Therefore, if the rear surface is uneven, heat is also released unevenly depending on the unevenness of the rear surface, leading to unevenness of the temperature distribution entirely over the semiconductor substrate.

Further, by the irradiation of the semiconductor substrate with ions, ions are accumulated in the semiconductor substrate at a certain depth, so that an embrittled region is formed. The ions of the irradiation are dispersed in accordance with the temperature distribution in the semiconductor substrate; thus, if the temperature distribution entirely over the semiconductor substrate is uneven, the ions are also dispersed unevenly.

The thickness of a semiconductor layer which is separated from such a semiconductor substrate with ions dispersed unevenly may be uneven.

In this specification, the "surface is uneven" means the surface is not flat and has a small step, roughness, or the like.

According to one embodiment of the present invention, a rear surface of a semiconductor substrate which is opposite to a surface of the same which is irradiated with ions is polished to be planarized. Heat generated by irradiation of the semiconductor substrate with ions as described above can be released evenly through the rear surface because the rear surface is planarized. Accordingly, the ions are dispersed evenly.

According to the one embodiment of the present invention, a semiconductor layer can be separated from the semiconductor substrate whose rear surface is polished, so that the thickness of the semiconductor layer is even.

One embodiment of the present invention is a method for manufacturing an SOI substrate, by which a semiconductor layer is formed over a base substrate. In the method, a first surface of a semiconductor substrate is polished to be planarized; a second surface of the semiconductor substrate which is opposite to the first surface is irradiated with ions, so that an embrittled region is formed in the semiconductor substrate; the second surface of the semiconductor substrate is attached to the base substrate, so that the semiconductor substrate is attached to the base substrate; and the semiconductor substrate and the base substrate are heated, so that separation in the embrittled region is performed. The value of $3\sigma$ ($\sigma$ denotes a standard deviation of thickness of the semiconductor layer) is less than or equal to 1.5 nm.

One embodiment of the present invention is a method for manufacturing an SOI substrate, by which a semiconductor layer is formed over a base substrate. In the method, a first surface of a semiconductor substrate is polished to be planarized; a first insulating layer is formed on the semiconductor substrate; a second surface of the semiconductor substrate which is opposite to the first surface is irradiated with ions, so that an embrittled region is formed in the semiconductor substrate; a second insulating layer is formed over the base substrate; the first insulating layer of the semiconductor substrate is attached to the second insulating layer of the base substrate, so that the semiconductor substrate is attached to the base substrate; the semiconductor substrate and the base substrate are heated, so that separation in the embrittled region is performed. The value of $3\sigma$ ($\sigma$ denotes a standard deviation of thickness of the semiconductor layer) is less than or equal to 1.5 nm.

According to one embodiment of the present invention, the first surface of the semiconductor substrate is polished by mechanical polishing or chemical mechanical polishing.

According to one embodiment of the present invention, a source gas of the ions is a gas containing hydrogen.

Although in general, the "SOI substrate" means a semiconductor substrate in which a silicon layer is provided on an insulating surface, the "SOI substrate" also includes in its category a semiconductor substrate in which a semiconductor layer formed using a material other than silicon is provided on an insulating surface in this specification and the like. That is, the semiconductor layer included in the "SOI substrate" is not limited to a silicon layer. In addition, in this specification and the like, the semiconductor substrate means not only a substrate formed only of a semiconductor material but also any substrate containing a semiconductor material. That is, the "SOI substrate" is also included in the category of the semiconductor substrate in this specification and the like.

Further, in this specification and the like, the "single crystal" means a crystal in which the direction of a certain crystal axis is aligned in the same direction throughout a sample thereof. That is, any crystal in which the direction of the crystal axis is uniform as described above is regarded as a single crystal even when a crystal defect, a dangling bond, or the like is included in the crystal.

Further, in this specification and the like, the "semiconductor device" means any device which can operate by utilizing semiconductor characteristics. For example, a display device and an integrated circuit are included in the category of the semiconductor device. Furthermore, in this specification and the like, the display device includes in its category a light emitting display device, a liquid crystal display device, and a display device including an electrophoretic element. The light emitting device includes a light emitting element, and the liquid crystal display device includes a liquid crystal element. The light emitting element includes in its category any element whose luminance is controlled by a current or a voltage; specifically, an inorganic electroluminescent (EL) element, an organic EL element, and the like are given.

The ordinal numbers such as "first", "second", and "third" are used for convenience and denote neither the order of steps nor the stacking order of layers. The ordinal numbers do not denote particular names which specify the present invention, either.

An SOI substrate including a semiconductor layer whose thickness is even can be provided according to one embodiment of the present invention.

BRIEF DESCRIPTION OF THE DRAWINGS

In the accompanying drawings.

DETAILED DESCRIPTION OF THE INVENTION

Figure 1A:
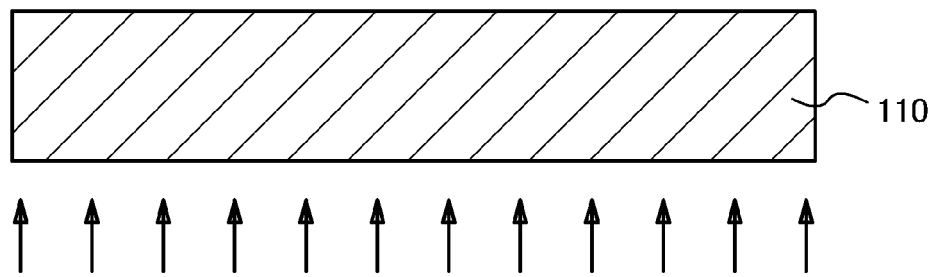
FIGS. 1A to 1C are cross-sectional views illustrating a manufacturing method of an SOI substrate.

Embodiments of the present invention disclosed in this specification are hereinafter described using the accompanying drawings. The present invention disclosed in this specification can be carried out in a variety of different modes, and it is easily understood for those skilled in the art that the modes and details of the present invention disclosed in this specification can be changed in various ways without departing from the spirit and scope of the present invention. Therefore, the present invention is not construed as being limited to description of the embodiments. The same portions or portions having similar functions are denoted by the same reference numerals in the drawings, and repeated description thereof is omitted.

In this specification and the like, the semiconductor device refers to any element or any device which functions by utilizing a semiconductor, and includes in its category any electric device such as an electronic circuit, a display device, a light emitting device, and the like and any electronic appliance equipped with such an electric device.

Embodiment 1

First, a semiconductor substrate 110 is prepared as a bond substrate. As the semiconductor substrate 110, a polycrystalline semiconductor substrate or a single crystal semiconductor substrate can be used. As the semiconductor substrate 110, for example, a semiconductor substrate that is formed of an element which belongs to Group 14, such as a polycrystalline or single crystal silicon substrate, a polycrystalline or single crystal germanium substrate, a polycrystalline or single crystal silicon germanium substrate, or a polycrystalline or single crystal silicon carbide substrate or a polycrystalline, or a compound semiconductor substrate using gallium arsenide, indium phosphate, or the like can be used. The size of the silicon substrate is typically 5 inches (125 mm) in diameter, 6 inches (150 mm) in diameter, 8 inches (200 mm) in diameter, and 12 inches (300 mm) in diameter, and a typical shape thereof is a circular shape. The shape of the silicon substrate is not necessarily a circular shape, and may be a rectangular shape. The case where a single crystal silicon substrate (a silicon wafer) having a rectangular shape is used as the semiconductor substrate 110 is described hereinafter.

Further, a base substrate 100 is prepared. As the base substrate 100, a light-transmitting glass substrate used for a liquid crystal display device or the like can be used. As the glass substrate, the one whose strain point is 600° C. or more is preferably used. Further, it is preferable that the glass substrate be a non-alkali glass substrate. As a material of the non-alkali glass substrate, a glass material such as aluminosilicate glass, aluminoborosilicate glass, or barium borosilicate glass is used, for example. The use of such a glass substrate as the base substrate 100, which is inexpensive and can be formed to have a large area, leads to lower cost than the case where a silicon substrate is used.

As the base substrate 100, a substrate formed of an insulator, such as a ceramic substrate, a quartz substrate, or a sapphire substrate, a semiconductor substrate formed of silicon, a substrate formed of a conductor such as metal or stainless steel, or the like can also be used. Further, a plastic substrate having a heat resistance high enough to withstand a process temperature in the manufacturing process may also be used as the base substrate 100. The case where a glass substrate having a rectangular shape is used as the base substrate 100 is described hereinafter. Unless otherwise specified, a square is also regarded as the rectangular shape.

An insulating layer 101 is formed over the base substrate 100. There is no particular limitation on the method for forming the insulating layer 101; a sputtering method, a plasma CVD method, or the like can be employed, for example. Since the insulating layer 101 has a surface to be attached, the insulating layer 101 is preferably formed such that the surface has high planarity. The insulating layer 101 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, when silicon oxide is used for the insulating layer 101, formation using an organosilane gas by a chemical vapor deposition method enables the insulating layer 101 to have excellent planarity. Although the insulating layer 101 has a single-layer structure in this embodiment, it may have a stacked-layer structure. The insulating layer 101 is not necessarily provided as long as a problem does not particularly occur in attachment.

Then, a rear surface of the semiconductor substrate 110 which is opposite to a surface of the semiconductor substrate 110 which is irradiated with hydrogen ions later is polished (see FIG. 1A). As the method for polishing, mechanical polishing, chemical mechanical polishing (CMP), or both of them can be employed. The chemical mechanical polishing (CMP) is used in this embodiment.

A process of the chemical mechanical polishing in this embodiment is described below. First polishing is performed on the rear surface of the semiconductor substrate 110, first. In the first polishing, ILD3013 manufactured by Nitta Haas Incorporated was used as polish (slurry) and T15 manufactured by Toray Industries, Inc. was used as a polishing pad. The polishing pressure was 0.02 MPa and the polishing time was 900 seconds in the first polishing.

Next, finishing polishing (second polishing) was performed thereon. In the finishing polishing, NP8020 manufactured by Nitta Haas Incorporated was used as polish (slurry) and Supreme manufactured by Nitta Haas Incorporated was used as a polishing pad. The polishing pressure was 0.02 MPa and the polishing time was 600 seconds in the finishing polishing. By the first polishing and finishing polishing, the rear surface of the semiconductor substrate 110 is polished by about 5 μm.

After the polishing, first cleaning for removing polished particles physically with a brush, second cleaning for cleaning plural times with ozone water and hydrofluoric acid, a jet cleaning with pure water and nitrogen, and third cleaning including pure water, ultrasonic cleaning were performed in this order thereon. Drying in a nitrogen atmosphere is performed thereon after the third cleaning.

Figure 3A:
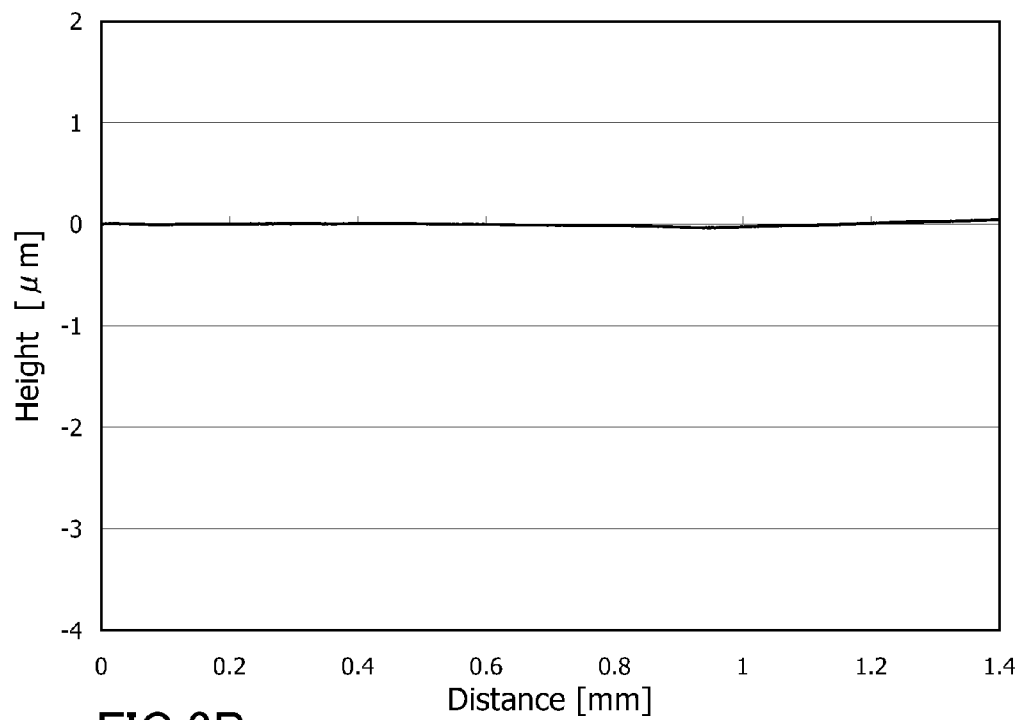
FIGS. 3A and 3B are graphs showing surface roughness of semiconductor substrates after being subjected to polishing.
Figure 3B:
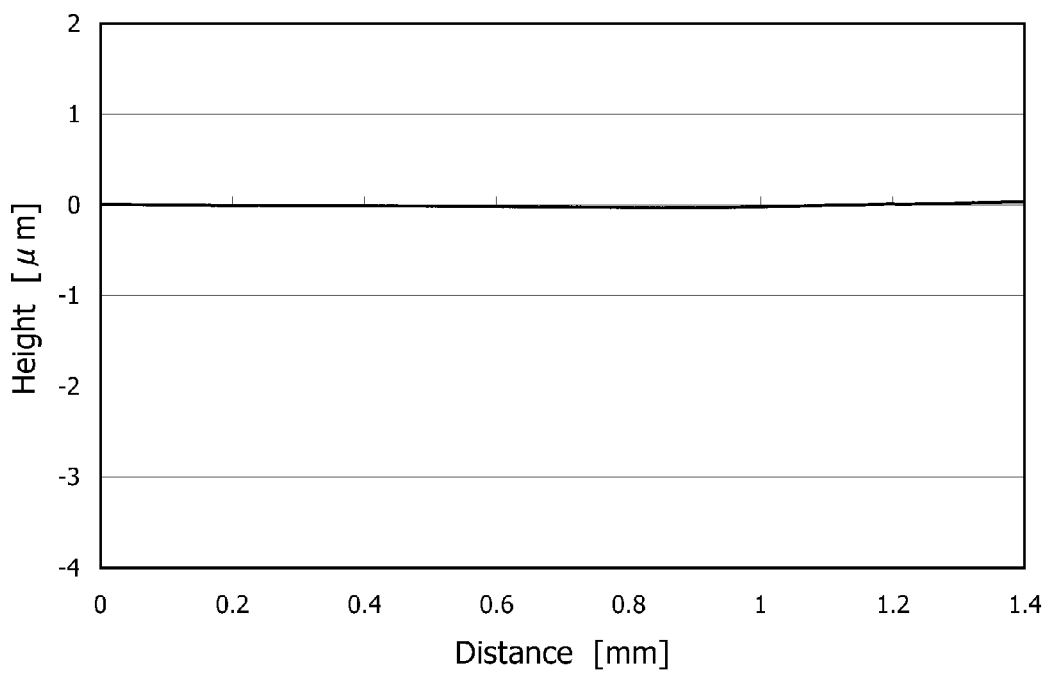

FIG. 3A shows surface roughness of the rear surface of the semiconductor substrate 110 after being polished by 5 μm (polished by a thickness of 5 μm from a top surface of the rear surface). FIG. 3B shows surface roughness of the rear surface of the semiconductor substrate 110 after being polished by 10 μm (polished by a thickness of 10 μm from the top surface of the rear surface). The semiconductor substrate 110 shown in FIG. 3A and the semiconductor substrate 110 shown in FIG. 3B are referred to as Sample A and Sample B, respectively.

Figure 4:
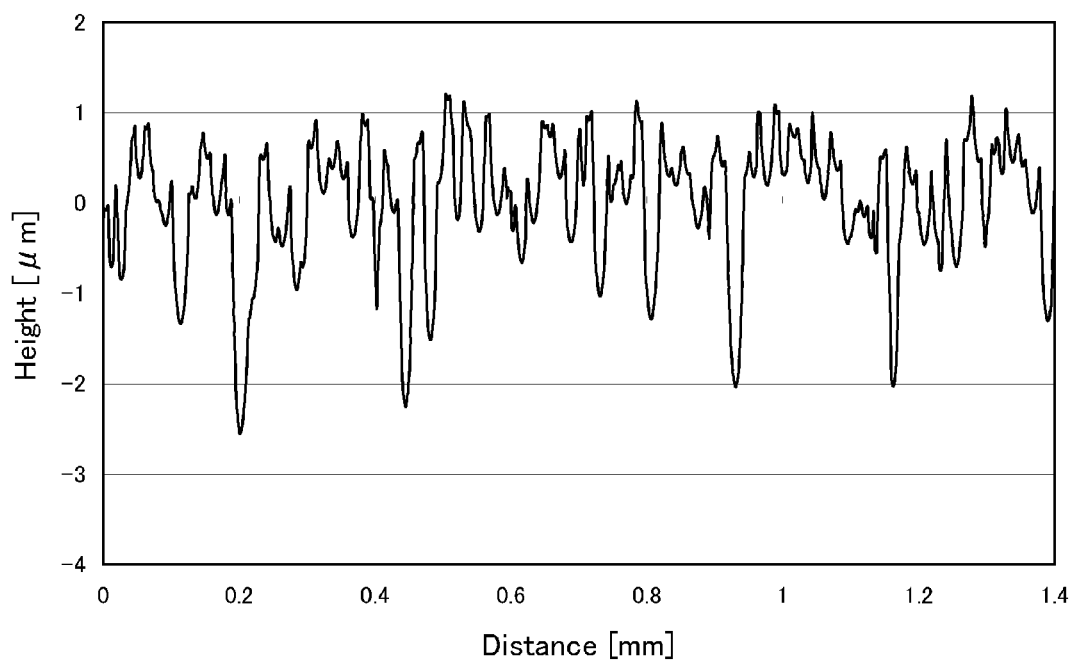
FIG. 4 is a graph showing surface roughness of a semiconductor substrate before being subjected to polishing.

For comparison, surface roughness of a rear surface of a semiconductor substrate which has not been polished is shown in FIG. 4. FIG. 4 shows surface roughness of a silicon wafer (a p-type silicon wafer with a plane direction (100) and a sheet resistance of greater than or equal to 15 Ωcm and less than or equal to 25 Ωcm) which has not been polished. The silicon wafer shown in FIG. 4 is referred to as Sample C.

The surface roughness shown in FIGS. 3A, 3B, and 4 was measured by a microfigure measuring instrument (Model ET4100 manufactured by Kosaka Laboratory Ltd.) which is a step measuring instrument. In the microfigure measuring instrument, a needle is set in contact with the sample and moved, whereby a step of the sample is measured.

In FIGS. 3A, 3B, and 4, a "distance" in the horizontal axis (x-axis) indicates a distance from one point in the direction parallel to the top surface of the semiconductor substrate (silicon wafer), and a "height" in the vertical axis (y-axis) indicates a height (or a depth) from the one point in the direction perpendicular to a top surface of the semiconductor substrate (silicon wafer).

As shown in FIG. 4, a variation in height of about 3.5 μm exists in the rear surface of the silicon wafer which has not been polished.

On the other hand, as shown in FIGS. 3A and 3B, few variations in height exist in the surface of the semiconductor substrate 110 after being polished. Further, the degree of variation in height is equivalent between FIGS. 3A and 3B, revealing that a surface sufficiently flat can be provided by polishing the semiconductor substrate 110 by 5 μm.

The surface of the semiconductor substrate 110 which is irradiated with ions may also be polished to remove impurities attaching to the surface. The same manner as the polishing of the rear surface may be applied to the polishing of the surface.

Figure 1B:
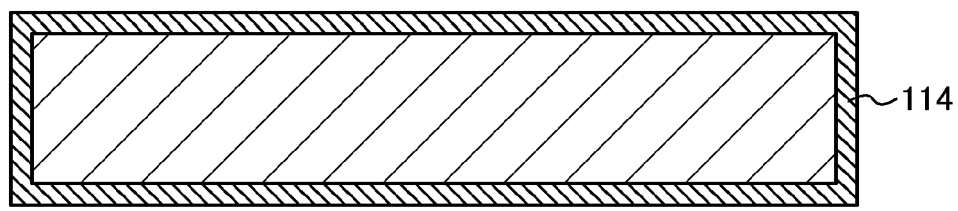

Next, an insulating layer 114 is provided for the semiconductor substrate 110 (see FIG. 1B).

As the insulating layer 114, a single layer of a silicon oxide layer, a silicon oxynitride layer, a silicon nitride layer, a silicon nitride oxide layer, or the like or a stacked-layer of these layers can be used. The insulating layer 114 can be formed by a CVD method, a sputtering method, or the like. In the case where the insulating layer 114 is formed by a CVD method, a silicon oxide layer formed using organosilane such as tetraethylorthosilicate (abbreviation: TEOS, chemical formula: $Si(OC_2H_5)_4$) is preferably used as the insulating layer 114 in terms of productivity.

The silicon oxynitride layer refers to a layer that contains more oxygen than nitrogen and contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively according to the measurement by Rutherford backscattering spectrometry (RBS) and hydrogen forward scattering (HFS). Further, the silicon nitride oxide layer refers to a layer that contains more nitrogen than oxygen, and contains oxygen, nitrogen, silicon, and hydrogen at concentrations ranging from 5 at. % to 30 at. %, 20 at. % to 50 at. %, 25 at. % to 35 at. %, and 15 at. % to 25 at. %, respectively according to the measurement by RBS and HFS. The respective content percentage of oxygen, nitrogen, silicon, and hydrogen are within the above-described ranges where the total number of atoms which constitute silicon oxynitride or silicon nitride oxide is 100 at. %.

The insulating layer 114 may also be formed by performing thermal oxidation treatment on the semiconductor substrate 110. In that case, the thermal oxidation treatment is preferably performed in an oxidation atmosphere with halogen added. As an example of such thermal oxidation treatment, it is preferable that thermal oxidation treatment be performed in an atmosphere containing hydrogen chloride (HCl) at 0.5 volume % to 10 volume % (preferably, 3 volume %) with respect to oxygen at a temperature of 900° C. to 1150° C. (for example, 950° C.). Processing time thereof may be set to 0.1 to 6 hours, preferably 0.5 to 1 hour. The thickness of an oxide film to be formed is set to 10 nm to 1000 nm (preferably, 50 nm to 200 nm), for example, 100 nm.

In this embodiment, thermal oxidation treatment in an atmosphere containing hydrogen chloride (HCl) is performed on the semiconductor substrate 110, so that the insulating layer 114 (here, a silicon oxide layer) is formed; thus, the insulating layer 114 contains a chlorine atom.

Although the insulating layer 114 is formed entirely on the semiconductor substrate 110 in this embodiment, the insulating layer 114 may be provided only for the surface of the semiconductor substrate 110 to which the base substrate 100 is attached (i.e., the surface which is irradiated with ions 103 later). The insulating layer 114 is not necessarily provided as long as a problem does not particularly occur in attachment.

Figure 1C:
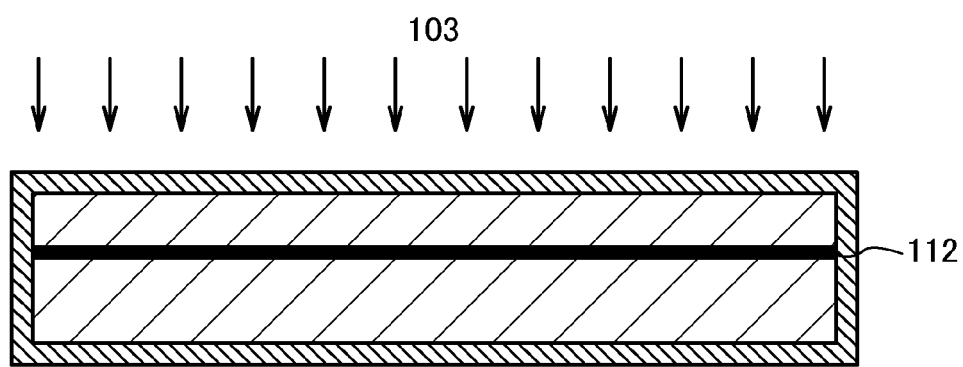

Next, the semiconductor substrate 110 with the insulating layer 114 is irradiated with the ions 103. The ions 103 irradiate the surface which is opposite to the rear surface which is polished as described above. In this manner, an embrittled region 112 is formed in the semiconductor substrate 110 (see FIG. 1C). For example, the semiconductor substrate 110 is irradiated with an ion beam which consists of the ions 103 accelerated, so that the embrittled region 112 is formed in the semiconductor substrate 110 at a certain depth from the top surface thereof. The depth where the embrittled region 112 is formed is controlled by the accelerating energy of the ion beam and the incidence angle thereof. In other words, the embrittled region 112 is formed in a region at a depth the same or substantially the same as the average penetration depth of the ions 103. Here, the depth at which the embrittled region 112 is formed is preferably uniform entirely over the semiconductor substrate 110.

The thickness of a semiconductor layer separated from the semiconductor substrate 110 is determined by the depth at which the embrittled region 112 is formed. The depth at which the embrittled region 112 is formed is greater than or equal to 50 nm and less than or equal to 1 µm, preferably greater than or equal to 50 nm and less than or equal to 300 nm from the top surface of the semiconductor substrate 110.

An ion implantation apparatus or an ion doping apparatus can be used to add the ions 103 to the semiconductor substrate 110. In the ion implantation apparatus, a source gas is excited to generate ion species, the ion species are mass-separated, and an object is irradiated with the ion specie(s) having a certain mass/certain masses. In the ion doping apparatus, a process gas is excited to generate ion species, the ion species are not mass-separated, and an object is irradiated with the ion species; however, in an ion doping apparatus equipped with a mass separator, irradiation with the ions 103 can be performed involving mass separation as in the ion implantation apparatus.

In the case of using an ion doping apparatus, the process for forming the embrittled region 112 can be performed, for example, under the following conditions.

The accelerating voltage is greater than or equal to 10 kV and less than or equal to 100 kV (preferably greater than or equal to 30 kV and less than or equal to 80 kV).

The dose is greater than or equal to $1\times10^{16}$ atoms/cm$^2$ and less than or equal to $4\times10^{16}$ atoms/cm$^2$.

The beam current density is greater than or equal to 2 µA/cm$^2$ (preferably greater than or equal to 5 µA/cm$^2$, further preferably greater than or equal to 10 µA/cm$^2$).

In the case of using the ion doping apparatus, a gas containing hydrogen can be used as a source gas. From the gas containing hydrogen, $H^+$, $H_2^+$, and $H_3^+$ ions can be generated as ion species. In the case of using such a gas containing hydrogen as the source gas, it is preferable to perform irradiation with a large amount of $H_3^+$. Specifically, it is preferable to use an ion beam in which $H_3^+$ is contained at 70% or more of the total of $H^+$, $H_2^+$, and $H_3^+$. It is further preferable that the proportion of $H_3^+$ ions be 80% or more. Such a high proportion of $H_3^+$ enables the embrittled region 112 to contain hydrogen at a concentration of greater than or equal to $1\times10^{20}$ atoms/cm$^3$, which facilitates separation in the embrittled region 112. Furthermore, with the irradiation with a large number of $H_3^+$ ions, formation of the embrittled region 112 takes shorter than the case of irradiation with $H^+$ ions and $H_2^+$ ions. Further, the use of $H_3^+$ ions leads to a reduction in the average penetration depth of the ions 103; thus, the embrittled region 112 can be formed in a shallow region.

In the case of using the ion implantation apparatus, it is preferable to perform irradiation with $H_3^+$ through mass separation. Of course, irradiation with $H^+$ or $H_2^+$ may also be performed in that case. Note that, since ion species are selected for irradiation in the case of using the ion implantation apparatus, the ion irradiation efficiency is decreased compared to the case of using the ion doping apparatus, in some cases.

As the source gas for the ion irradiation, as well as a gas containing hydrogen, one or more kinds of gases selected from a rare gas such as helium or argon; a halogen gas typified by a fluorine gas or a chlorine gas; or a halogen compound gas such as a fluorine compound gas (e.g., $BF_3$) can be used. When helium is used as the source gas, an ion beam with high proportion of $He^+$ ions can be formed without mass separation, by which the embrittled region 112 can be formed efficiently.

Further, the embrittled region 112 can also be formed by performing irradiation with the ions 103 plural times. In that case, the ion irradiation may be performed with different source gases or the same source gas. For example, ion irradiation can be performed using a rare gas as a source gas, and then, ion irradiation can be performed using a gas containing hydrogen as a source gas. Further or alternatively, ion irradiation can performed first using a halogen gas or a halogen compound gas, and then, ion irradiation can be performed using a gas containing hydrogen.

The irradiation of the semiconductor substrate 110 with the ions 103 generates heat to increase the temperature of the semiconductor substrate 110.

In this embodiment of the present invention, the rear surface of the semiconductor substrate 110 which is opposite to the surface of the same which is irradiated with the ions 103 is polished to be planarized. Therefore, heat generated by the irradiation of the semiconductor substrate 110 with the ions 103 is released evenly through the rear surface. Accordingly, the temperature distribution entirely over the semiconductor substrate 110 also becomes even, and the ions 103 are dispersed evenly in the semiconductor substrate 110.

Accordingly, a semiconductor layer whose thickness is even can be separated from the semiconductor substrate 110 as described later in the manufacturing process.

Next, at least one of the insulating layer 114 formed over the semiconductor substrate 110 and the base substrate 100 is preferably subjected to surface treatment. The surface treatment can improve the bonding strength at the bonding interface between the semiconductor substrate 110 and the base substrate 100. The surface treatment can also reduce particles (also referred to as dust) or the like on the substrate, leading to a reduction in bonding defects due to particles or the like. Note that the surface treatment can also be performed on the insulating layer 101 formed over the base substrate 100, if necessary.

As examples of the surface treatment, a wet treatment, a dry treatment, and a combination of both are given. A combination of different wet treatments or a combination of different dry treatments may also be employed.

As examples of the wet treatment, ozone treatment using ozone water (ozone water cleaning), megasonic cleaning, two-fluid cleaning (a method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The surface treatment as described above has the effect of improving hydrophilicity and cleanliness of a top surface of the object to be subjected (i.e., the semiconductor substrate 110, the insulating layer 114 formed over the semiconductor substrate 110, the base substrate 100). Consequently, the bonding strength between the substrates can be improved. In addition, since the surface treatment can reduce particles or the like on the substrate, generation of bonding defects due to particles or the like can be suppressed.

The wet treatment is effective for the removal of macro dust and the like attaching to the top surface of the object. The dry treatment is effective for the removal or decomposition of micro dust such as an organic substance attaching to the top surface of the object. Therefore, it is preferable to perform the dry treatment such as ultraviolet treatment and the wet treatment such as cleaning sequentially on the object because the top surface of the object can be made clean and hydrophilic and generation of watermarks on the top surface of the object can be suppressed.

After the wet treatment, the object is preferably dried. As the drying method, a method of spraying a gas with an air knife, drying with IPA (a method in which water is replaced with the vapor of isopropyl alcohol), drying with spinning, or the like can be employed.

As an example of the dry treatment, plasma treatment is described below. Here, the plasma treatment is performed in a plasma state which is produced by introducing an inert gas (such as an argon gas) into a chamber in a vacuum state and applying a bias voltage to the top surface of the object (e.g., the base substrate 100). In the plasma, an electron and a cation of Ar are present, and the cation of Ar is accelerated in the cathode direction (towards the base substrate 100 side). The accelerated Ar cation collides against the top surface of the the base substrate 100, whereby the top surface of the base substrate 100 is etched by sputtering. A projection of the top surface of the base substrate 100 is preferentially etched by sputtering; thus, the planarity of the top surface of the base substrate 100 can be improved. Further, by the accelerated Ar cation, impurities such as an organic substance on the base substrate 100 can be removed, so that the base substrate 100 can be activated. Alternatively, plasma treatment can also be performed in a plasma state produced by introducing a reactive gas (such as an $O_2$ gas or an $N_2$ gas) in addition to the inert gas into a chamber in a vacuum state and applying a bias voltage to the top surface of the object. By the reactive gas, defects caused by etching of the top surface of the base substrate 100 by sputtering can be repaired. The plasma treatment causes generation of a dangling bond on the top surface of the object, so that the top surface is activated to be suitable for bonding. Further, ions accelerated by the plasma treatment are implanted into a surface layer of the object, whereby a defect such as distortion is formed in the surface layer; accordingly, moisture dispersion at the attachment interface is facilitated, so that absorption of moisture can be increased.

As another example of the dry treatment, surface treatment using oxygen in an active state in combination with ultraviolet light is described below.

Ozone or oxygen in an active state such as singlet oxygen can effectively remove or decompose organic substances attaching to the top surface of the object. Further, the treatment using ozone or oxygen in an active state such as singlet oxygen may be combined with treatment using ultraviolet light having wavelengths less than 200 nm, so that the organic substances attaching to the top surface of the object can be removed more effectively.

For example, irradiation with ultraviolet light may be performed under an atmosphere containing oxygen to perform the surface treatment of the object. Under the atmosphere containing oxygen, irradiation with ultraviolet light having wavelengths less than 200 nm and ultraviolet light having wavelengths greater than or equal to 200 nm can generate ozone and singlet oxygen, and irradiation with ultraviolet light having wavelengths less than 180 nm can also generate ozone and singlet oxygen.

An example of a reaction which is caused by the irradiation with ultraviolet light having wavelengths of less than 200 nm and ultraviolet light having wavelengths of greater than or equal to 200 nm under the atmosphere containing oxygen is described below:

$$O_2 + h\nu(\lambda_1 \text{ nm}) \rightarrow O(^3P) + O(^3P) \tag{1}$$

$$O(^3P) + O_2 \rightarrow O_3 \tag{2}$$

$$O_3 + h\nu(\lambda_2 \text{ nm}) \rightarrow O(^1D) + O_2 \tag{3}$$

In the reaction formula (1), irradiation with light (hv) having a wavelength ($\lambda_1$ nm) of less than 200 nm in an atmosphere containing oxygen ($O_2$) generates an oxygen atom ($O(^3P)$) in a ground state. Next, in the reaction formula (2), the oxygen atom ($O(^3P)$) in the ground state reacts with the oxygen ($O_2$), whereby ozone ($O_3$) is generated. Then, in the reaction formula (3), irradiation with light having a wavelength ($\lambda_2$ nm) of greater than or equal to 200 nm in the atmosphere containing the ozone ($O_3$) generates singlet oxygen $O(^1D)$ in an excited state. In the atmosphere containing oxygen, the irradiation with light having a wavelength of less than 200 nm among ultraviolet light is performed to generate ozone, and the irradiation with light having a wavelength of greater than or equal to 200 nm among ultraviolet light is performed to decompose ozone to generate singlet oxygen. The above-described surface treatment can be performed by, for example, irradiation with a low-pressure mercury lamp ($\lambda_1$=185 nm, $\lambda_2$=254 nm) under an atmosphere containing oxygen.

An example of a reaction which is caused by the irradiation with ultraviolet light having wavelengths of less than 180 under the atmosphere containing oxygen is described below:

$$O_2 + h\nu(\lambda_3 \text{ nm}) \rightarrow O(^1D) + O(^3P) \tag{4}$$

$$O(^3P) + O_2 \rightarrow O_3 \tag{5}$$

$$O_3 + h\nu(\lambda_3 \text{ nm}) \rightarrow O(^1D) + O_2 \tag{6}$$

In the reaction formula (4), irradiation with ultraviolet light having a wavelength ($\lambda_3$ nm) of less than 180 nm is performed in an atmosphere containing oxygen ($O_2$) to generate singlet oxygen O($^1$D) in an excited state and an oxygen atom (O($^3$P)) in a ground state. Next, in the reaction formula (5), the oxygen atom (O($^3$P)) in the ground state reacts with the oxygen (O$_2$), so that ozone (O$_3$) is generated. In the reaction formula (6), the irradiation with the ultraviolet light having the wavelength ($\lambda_3$ nm) of less than 180 nm is performed in the atmosphere containing ozone (O$_3$) to generate singlet oxygen in an excited state and oxygen. In the atmosphere containing oxygen, the irradiation with light containing a wavelength of less than 180 nm among ultraviolet light is performed to generate ozone and to decompose the ozone or oxygen to generate singlet oxygen. The above-described surface treatment can be performed by, for example, irradiation with a Xe excimer UV lamp under an atmosphere containing oxygen.

As described above, with the ultraviolet light having a wavelength less than 200 nm, a chemical bond in an organic substance and the like attaching to the top surface of the object can be cut, and with ozone or singlet oxygen, an organic substance attaching to the top surface of the object, the organic substance whose chemical bond is cut, or the like can be removed by oxidative decomposition. Accordingly, the surface treatment described above can enhance hydrophilicity and cleanliness of a top surface of the object; thus, generation of attachment defects can be suppressed in the attachment of the semiconductor substrate 110 and the base substrate 100.

In this embodiment, as the surface treatment, the dry treatment and the wet treatment are performed on the base substrate 100 and the surface of the semiconductor substrate 110 which is irradiated with the ions 103. First, as the dry treatment, irradiation using a Xe excimer UV lamp is performed in an atmosphere containing oxygen. Next, as the wet treatment, cleaning with an alkaline cleaner, brush cleaning, or two-fluid cleaning (a method in which pure water and air are sprayed together) is performed. After that, by a method of spraying a gas with an air knife or drying with IPA, the base substrate 100 and the semiconductor substrate 110 are dried.

Figure 2A:
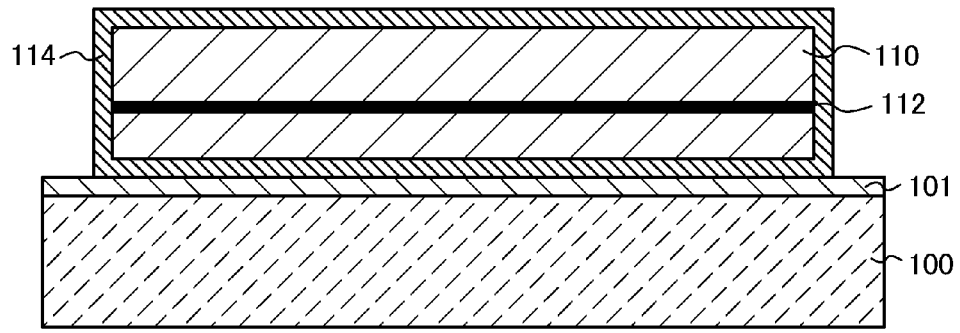
FIGS. 2A to 2C are cross-sectional views illustrating a manufacturing method of an SOI substrate.

Next, the base substrate 100 is attached to the semiconductor substrate 110 (see FIG. 2A). Specifically, the insulating layer 101 formed over the base substrate 100 is attached to the insulating layer 114 formed on the semiconductor substrate 110.

In the attachment of the base substrate 100 and the semiconductor substrate 110, at least one of the base substrate 100 and the semiconductor substrate 110 may be heated, whereby generation of defects caused by the attachment interface between the base substrate 100 and the semiconductor substrate 110 can be suppressed. In the case where the base substrate 100 is heated, the heating temperature of the base substrate 100 is set to higher than or equal to 50° C. and lower than or equal to 100° C., preferably higher than or equal to 55° C. and lower than or equal to 95° C. There is no particular limitation on the heating time, which is set as appropriate so that the base substrate 100 reaches an appropriate temperature; for example, the base substrate 100 can be heated for 180 seconds.

Next, the base substrate 100 heated to the appropriate temperature is pressed to make an end portion of the base substrate 100 in contact with an end portion of the semiconductor substrate 110. With the use of a pin or the like, a point of the base substrate 100 or the semiconductor substrate 110, for example, a central portion of the base substrate 100 can be pressed, whereby the base substrate 100 may be in contact with the semiconductor substrate 110. The attachment of the base substrate 100 and the semiconductor substrate 110 proceeds concentrically from the portion where they are in contact with each other. For example, when the attachment starts from respective ones of the corner portions of the base substrate 100 and the semiconductor substrate 110, the attachment proceeds concentrically toward respective opposite corners of the respective ones, to their entire top surfaces.

A hydrogen bond or van der Waals forces act(s) on the attachment of the base substrate 100 and the semiconductor substrate 110. To make the hydrogen bond or van der Waals forces act, a hydroxyl group and water are needed. Therefore, a shortage of the hydroxyl group or water on the base substrate 100 and the semiconductor substrate 110 prevents spontaneous bonding of the base substrate 100 and the semiconductor substrate 110 and thus the attachment cannot be performed.

On the other hand, too much moisture on the base substrate 100 or the semiconductor substrate 110 increases the speed of the attachment, resulting in that a gas or particles are confined at the attachment interface. Further, in the outer edge portion of the semiconductor substrate 110 or near the point at which the attachment is terminated, the speed of the attachment tends to vary and a gas or particles is/are more likely to be confined. In this specification and the like, a minute airspace exists between the base substrate 100 and the semiconductor substrate 110, which is caused by such a gas or particles confined, is referred to as a void. The outer edge portion of the semiconductor substrate 110 means a region within about 5 mm from the edge of the semiconductor substrate 110.

Further, too much moisture on the base substrate 100 or the semiconductor substrate 110 leads to remaining of unnecessary moisture for the attachment (hereinafter referred to as surplus moisture) at the attachment interface between the base substrate 100 and the semiconductor substrate 110. The surplus moisture remaining at the attachment interface is heated and evaporated in a later heat treatment, laser light irradiation, or the like, which forms a void in a portion where the surplus moisture remains or the void is burst, appearing as an attachment defect. The attachment defect caused by such surplus moisture appears entirely over the substrate and is a big element of attachment defects.

Therefore, with heating on at least one of the base substrate 100 and the semiconductor substrate 110, surplus moisture can be reduced while a necessary amount of moisture for the attachment remains on the base substrate 100 and the semiconductor substrate 110. In this manner, confinement of a gas or particles at the attachment interface can be suppressed. Consequently, generation of voids at the attachment interface (particularly, within about 5 mm away from the edge of the substrate) can be suppressed.

In addition to the above effects, with the heating on at least one of the base substrate 100 and the semiconductor substrate 110, remaining of the surplus moisture at the attachment interface can be suppressed. Accordingly, defects due to surplus moisture which appear in the subsequent process can be suppressed.

Further, when plasma treatment is performed as the surface treatment, accelerated ions are introduced into the surface layer(s) of the base substrate 100 and/or the semiconductor substrate 110, whereby a defect such as distortion is formed in the surface layer(s). Accordingly, diffusion of surplus moisture at the attachment interface is facilitated, so that the surplus moisture can be absorbed in the defect such as distortion of the surface layer(s). Therefore, remaining of the surplus moisture at the attachment interface can be suppressed. Accordingly, defects due to surplus moisture which appear in the subsequent process can be suppressed. Note that the surface layers of the base substrate 100 and the semiconductor substrate 110 are respective top surfaces of the insulating layer 114 formed over the semiconductor substrate 110 and the base substrate 100, or respective top surfaces of the insulating layer 114 formed over the semiconductor substrate 110 and the insulating layer 101 formed over the base substrate 100.

Further, before the base substrate 100 is in contact with the semiconductor substrate 110, the base substrate 100 may be cooled to an appropriate temperature after being heated. Remaining of surplus moisture at the attachment interface can also be suppressed since the amount of moisture on the base substrate 100 and the semiconductor substrate 110 can be controlled even when cooling is performed on at least one of the base substrate 100 and the semiconductor substrate 110 after being heated. Accordingly, defects due to surplus moisture which appear in the subsequent process can be suppressed.

Then, after the semiconductor substrate 110 is attached to the base substrate 100, it is preferable to perform heat treatment on the semiconductor substrate 110 and the base substrate 100 to strengthen the attachment. The temperature of the heat treatment is needed to be a temperature at which separation in the embrittled region 112 does not start; for example, the temperature is set to lower than 400° C., preferably lower than or equal to 300° C. The heat treatment time is not particularly limited and can be set as appropriate depending on the relation between processing time and attachment strength. The heat treatment can be performed with a heating furnace such as a diffusion furnace or a resistance heating furnace, a rapid thermal annealing (RTA) apparatus, or the like. Further, only the attachment region can be locally heated by irradiation with microwaves or the like. The heat treatment may be skipped when the attachment strength is sufficiently high. In this embodiment, heat treatment is performed at 200° C. for two hours.

Figure 2B:
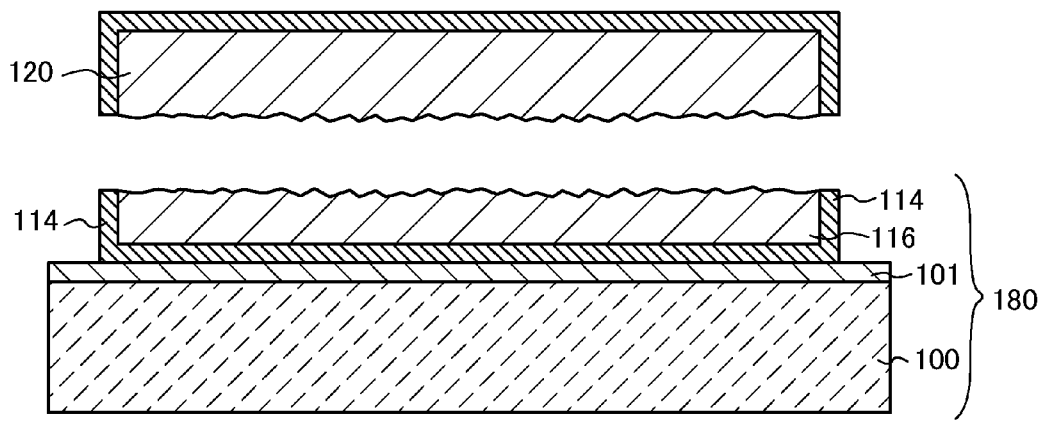

Next, heat treatment is performed thereon, so that the semiconductor substrate 110 is separated into a semiconductor layer 116 and a semiconductor substrate 120 along the embrittled region 112 (see FIG. 2B). Through the above, an SOI substrate 180 in which the semiconductor layer 116 is provided over the base substrate 100 with the insulating layer 114 and the insulating layer 101 provided therebetween can be obtained. Note that in the case where the insulating layer 101 is not formed over the base substrate 100, the semiconductor layer 116 is provided over the base substrate 100 with the insulating layer 114 provided therebetween in the SOI substrate 180.

With the heat treatment, atoms added in the ion doping are deposited in microvoids in the embrittled region 112 by an increase in temperature, and thus the internal pressure of the microvoids is increased. The increase in pressure changes the volume in the microvoids in the embrittled region 112, leading to separation of the semiconductor substrate 110 in the embrittled region 112. Since the insulating layer 114 is bonded to the base substrate 100, the semiconductor layer 116 which is separated from the semiconductor substrate 110 is provided over the base substrate 100 with the insulating layer 114 provided therebetween. The temperature of the heat treatment is set to a temperature below the strain point of the base substrate 100. For example, in the case of using a glass substrate as the base substrate 100, the heat treatment temperature is preferably set to be higher than or equal to 400° C. and lower than or equal to 750° C.; however, the temperature is not limited thereto as long as the glass substrate can withstand the temperature. This heat treatment can be performed with a heating furnace such as a diffusion furnace or a resistance heating furnace, a rapid thermal annealing (RTA) apparatus, a microwave heating apparatus, or the like. In this embodiment, heat treatment is performed at 600° C. for two hours.

Without performing the above-described heat treatment for strengthening the attachment between the base substrate 100 and the semiconductor substrate 110, a heat treatment step for strengthening the attachment between the base substrate 100 and the insulating layer 114 and a heat treatment step for separating along the embrittled region 112 may be performed at the same time.

If surplus moisture remains at the attachment interface between the base substrate 100 and the semiconductor substrate 110, the surplus moisture is heated and evaporated in the above-described heat treatment step. Accordingly, a void is formed in a portion where the surplus moisture exists. Further, the void may be burst, resulting in a lack of part of the semiconductor layer 116 or the insulating layer 114. In this manner, an attachment defect appears in the heat treatment step. However, by heating at least one of the base substrate 100 and the semiconductor substrate 110 before attachment of the base substrate 100 and the semiconductor substrate 110, the amount of moisture on both the substrates can be controlled and thus remaining of surplus moisture at the attachment interface can be suppressed. Accordingly, formation of a void at the attachment interface or a burst of the void can be prevented, so that generation of defects which is caused by surplus moisture and appears in the heat treatment step can be suppressed. Similarly, even when at least one of the base substrate 100 and the semiconductor substrate 110 is heated and then cooled, the above effect can also be obtained.

Figure 5:
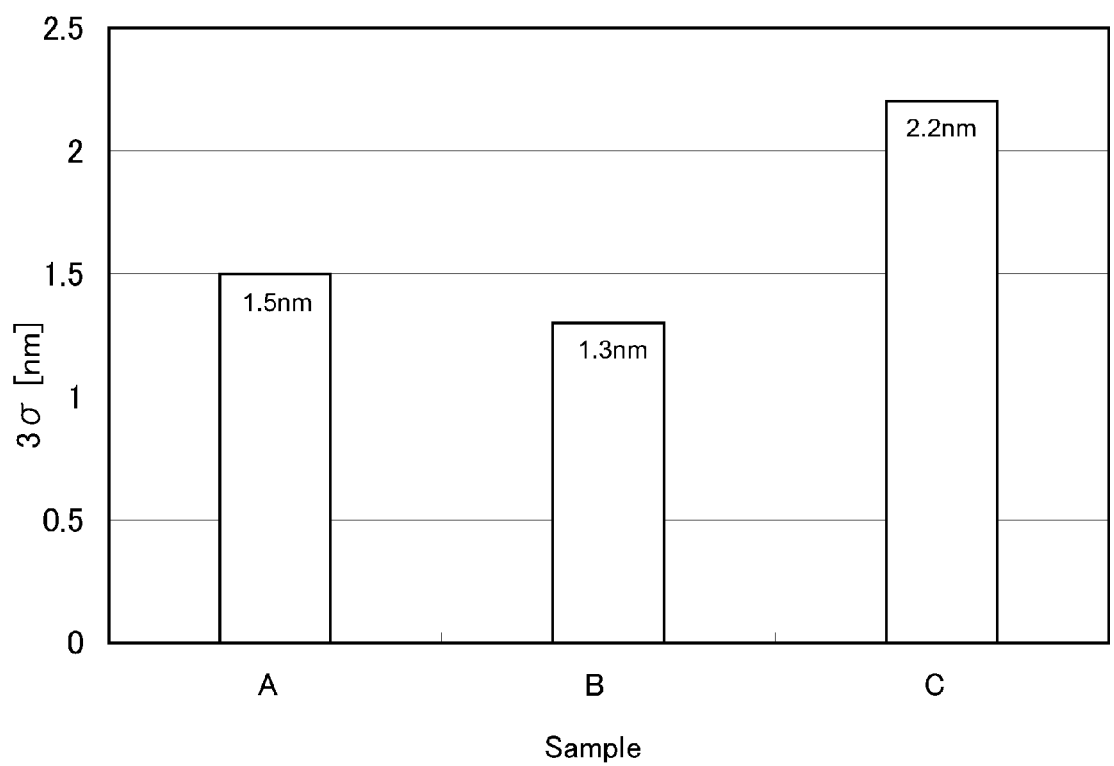
FIG. 5 is a graph showing variations in thickness of a separated semiconductor layer.

FIG. 5 shows variations in the thickness of respective semiconductor layers 116 separated from the semiconductor substrate 110 (Sample A) whose rear surface has been polished by 5 μm, the semiconductor substrate 110 (Sample B) whose rear surface has been polished by 10 μm, and the semiconductor substrate 110 (Sample C) which has not been polished.

First, a variation of each semiconductor layer 116 separated from Samples A to C was measured with a light interferometer thickness measuring device, NanoSpec 6100 (produced by Nanometerics, USA). Specifically, the thickness was measured at in-plane 25 points of the semiconductor layer 116. The values of 3σ (σ denotes a standard deviation of thickness of the semiconductor layer, which was calculated from the measured values) are shown in FIG. 5. The reason why 3σ that is a triple of the standard deviation σ is used is that the percentage of measured values of a random variable in accordance with a normal distribution with the average and the standard deviation σ, which fell within the range from a standard value −3σ to a standard value +3σ, accounts for 99.7%.

As shown in FIG. 5, 3σ of Sample A (polished by 5 μm) and 3σ of Sample B (polished by 10 μm) are 1.5 nm and 1.3 nm, respectively.

On the other hand, 3σ of Sample C (silicon wafer without polishing) was 2.2 nm. Since the smaller 3σ is, the smaller the variation is, the thickness variation of either Sample A (polished by 5 μm) or Sample B (polished by 10 μm) is smaller than that of Sample C (silicon wafer without polishing).

It can be confirmed from the above that polishing of the rear surface (opposite to the surface irradiated with the ions 103) of the semiconductor substrate 110 leads to a reduction in the variation of the thickness of the semiconductor layer 116. Specifically, 3σ can be suppressed to less than or equal to 1.5 nm in the semiconductor layer 116 according to this embodiment where σ is a standard deviation of thickness of the semiconductor layer 116.

Next, planarization treatment is preferably performed on the semiconductor layer 116 of the SOI substrate 180. Even when roughness or a defect due to the separation step or the ion irradiation step occurs in a top surface of the semiconductor layer 116, the planarization treatment on the SOI substrate 180 including the semiconductor layer 116 can planarize the top surface of the semiconductor layer 116.

The planarization treatment can be performed by chemical mechanical polishing (CMP), etching treatment, laser light irradiation, or the like. In this embodiment, the semiconductor layer 116 is irradiated with laser light, whereby the semiconductor layer 116 is recrystallized and its top surface is planarized.

The irradiation with laser light is performed on the top surface side of the semiconductor layer 116, whereby the top surface of the semiconductor layer 116 is melted, which is followed by cooling of the semiconductor layer 116 to be solidified, so that a semiconductor layer 118 whose planarity of the top surface is improved can be obtained. Since the laser light is used, the base substrate 100 is not directly heated, and thus the temperature rise of the base substrate 100 can be suppressed. Therefore, a low-heat-resistant substrate such as a glass substrate can be used as the base substrate 100.

It is preferable that the melting of the semiconductor layer 116 by laser light irradiation be partial melting. This is because complete melting leads to generation of random nuclei following a change to a liquid phase to cause microcrystallization, bringing a high possibility of a reduction in the crystallinity. On the other hand, partial melting enables crystal growth to proceed from a non-melted solid phase portion; accordingly, defects in the semiconductor layer 116 can be reduced. The "complete melting" of the semiconductor layer 116 herein means that the semiconductor layer 116 is melted into a liquid state down to the vicinity of its lower interface. On the other hand, the "partial melting" of the semiconductor layer 116 means that the upper portion of the semiconductor layer 116 is melted into a liquid phase while the lower portion thereof is not melted and is still in a solid phase.

A pulsed laser is preferably used for the laser light irradiation. This is because high-energy pulsed laser light can be emitted instantaneously to easily melt. The oscillation frequency is preferably set to be greater than or equal to about 1 Hz and less than or equal to about 10 MHz.

If surplus moisture remains at the attachment interface between the base substrate 100 and the semiconductor substrate 110, the surplus moisture is heated and evaporated in laser light irradiation. Accordingly, a void is formed in a portion where the surplus moisture exists. Further, the void may be burst, leading to a lack of part of the semiconductor layer 118 or the insulating layer 114. In this manner, attachment defects appear in the laser light irradiation. Further, if a void is formed at the attachment interface in the above-described heat treatment step or the laser light irradiation step, the energy distribution of the laser light becomes uneven. Consequently, a bump of the semiconductor layer 118 or a lack of part of the semiconductor layer 118 or the insulating layer 114 may occur. However, by heating at least one of the base substrate 100 and the semiconductor substrate 110 before attachment of the base substrate 100 and the semiconductor substrate 110, the amount of moisture on both the substrates can be controlled and thus remaining of surplus moisture at the attachment interface can be suppressed. Accordingly, formation of a void at the attachment interface or a burst of the void can be prevented, whereby defects which are caused by surplus moisture and appear in the laser light irradiation step can be reduced. Further, the planarization treatment step with laser light can be favorably performed. Similarly, even when at least one of the base substrate 100 and the semiconductor substrate 110 is heated and then cooled, the above effect can also be obtained.

After the above-described laser light irradiation, the thickness of the semiconductor layer 118 may be thinned. The semiconductor layer 118 may be thinned by etching treatment (etch-back treatment) by one or both of dry etching and wet etching. For example, in the case where the semiconductor layer 118 is formed using a silicon material, the semiconductor layer 118 can be thinned by dry etching using $SF_6$ and $O_2$ as a process gas.

The planarization treatment may also be performed on the semiconductor substrate 120, in addition to the SOI substrate 180. By planarizing a top surface of the semiconductor substrate 120, the semiconductor substrate 120 can be reused in a process for manufacturing an SOI substrate.

Figure 2C:
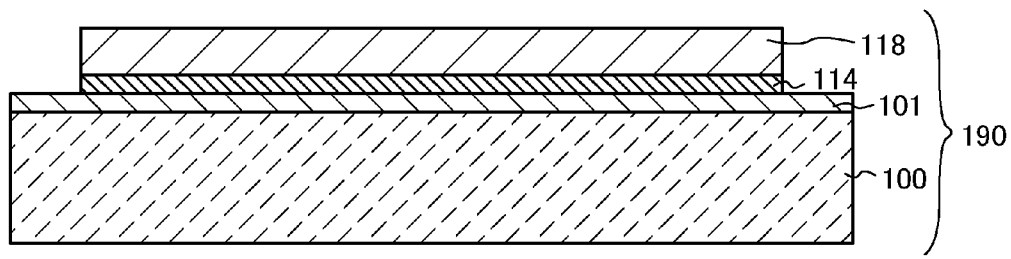

Through the above process, an SOI substrate 190 in which the semiconductor layer 118 is provided over the base substrate 100 with the insulating layer 101 and the insulating layer 114 provided therebetween can be manufactured (see FIG. 2C). Note that in the case where the insulating layer 101 is not formed over the base substrate 100, the semiconductor layer 118 is provided over the base substrate 100 with the insulating layer 114 provided therebetween in the SOI substrate 190.

Although the laser light irradiation on the semiconductor layer 116 precedes the etching treatment in this embodiment, one embodiment of the present invention is not limited thereto: the etching treatment may be performed before the laser light irradiation, or both before and after the laser light irradiation.

Although laser light is used to reduce in defects and improve the planarity in this embodiment, one embodiment of the present invention is not limited thereto. Reduction in defects and/or improvement in planarity may be realized by any another method such as heat treatment. Even when heat treatment is employed to reduce defects and/or improve the planarity, it is effective to perform the heat treatment on at least one of the base substrate 100 and the semiconductor substrate 110 to suppress generation of attachment defects caused by surplus moisture. Further, the treatment for reducing defects can be skipped if it is unnecessary.

Though the above, an SOI substrate including a semiconductor layer whose thickness is even can be provided according to this embodiment.

Embodiment 2

Figure 6A:
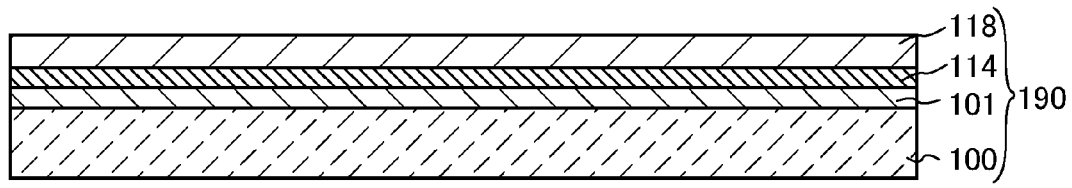
FIGS. 6A to 6D are cross-sectional views illustrating a manufacturing method of a semiconductor device.

FIG. 6A is a cross-sectional view illustrating a part of the SOI substrate (see FIG. 2C) manufactured using the method described in Embodiment 1.

In order to control the threshold voltage of a thin film transistor (TFT), a p-type impurity element such as boron, aluminum, or gallium, or an n-type impurity element such as phosphorus or arsenic may be added to the semiconductor layer 118. A region to which the impurity element is added and the kind of the impurity element can be determined as appropriate. For example, a p-type impurity element is added to a formation region of an n-channel TFT, and an n-type impurity element is added to a formation region of a p-channel TFT. The impurity element may be added to a dose of about greater than or equal to $1 \times 10^{15}$ atoms/cm$^2$ and less than or equal to $1 \times 10^{17}$ atoms/cm$^2$.

Figure 6B:
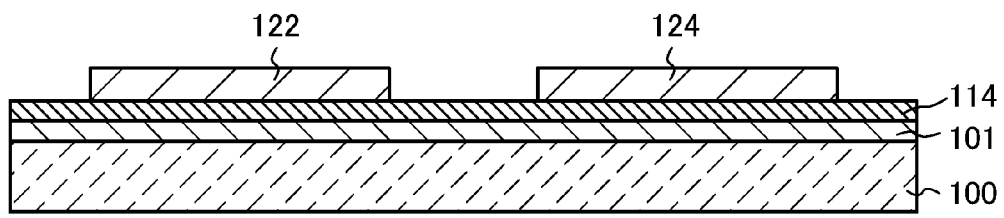

Then, the semiconductor layer 118 is separated into island shapes, so that semiconductor layers 122 and 124 are formed (see FIG. 6B).

Figure 6C:
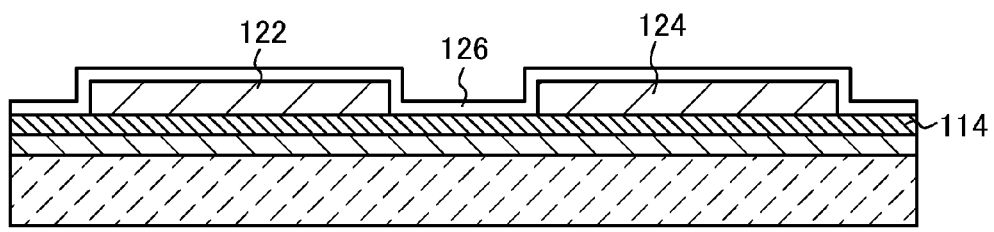

Then, an insulating film 126 is formed to cover the semiconductor layers 122 and 124 (see FIG. 6C). Here, a single layer of a silicon oxide film is formed by a plasma CVD method. Alternatively, a single layer or a stacked layer using a film containing silicon oxynitride, silicon nitride oxide, silicon nitride, hafnium oxide, aluminum oxide, tantalum oxide, or the like may be formed as the insulating film 126.

As another method for forming the insulating film 126, other than a plasma CVD method, a sputtering method or a method using oxidation or nitridation by high density plasma treatment can be given. The high-density plasma treatment is performed using, for example, a mixed gas of a rare gas such as helium, argon, krypton, or xenon and a gas such as oxygen, nitrogen oxide, ammonia, nitrogen, or hydrogen. In that case, by exciting plasma by introduction of microwaves, plasma with a low electron temperature and high density can be generated. Top surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since the oxidation or nitridation of the semiconductor layers 122 and 124 by the high-density plasma treatment is a solid-phase reaction, the interface state density between the insulating film 126 and the semiconductor layer 122, 124 can be drastically decreased. Further, with the direct oxidation or nitridation of the semiconductor layers 122 and 124 by the high-density plasma treatment, a variation in the thickness of the insulating film 126 can be suppressed. Furthermore, since the semiconductor layers 122 and 124 are single crystal layers, even when the top surfaces of the semiconductor layers 122 and 124 are oxidized by a solid-phase reaction with the high-density plasma treatment, the uniformity and the interface state density of the insulating film 126 can be increased. The use of the insulating film 126 formed by the high-density plasma treatment as described above as a part or whole of a gate insulating film of the transistor leads to suppression of variation in characteristics of the transistor.

Alternatively, the gate insulating film may be formed by thermally oxidizing the semiconductor layers 122 and 124. In the case where such thermal oxidation is employed, it is necessary to use a glass substrate having a certain degree of heat resistance.

The insulating film 126 may be formed to contain hydrogen, and hydrogen in the insulating film 126 may be diffused into the semiconductor layers 122 and 124 by performing heat treatment at a temperature of higher than or equal to 350° C. and lower than or equal to 450° C. on the insulating film 126. In that case, the insulating film 126 can be formed using silicon nitride or silicon nitride oxide by a plasma CVD method. The process temperature is preferably set to be lower than or equal to 350° C. With hydrogen supplied to the semiconductor layers 122 and 124 in this manner, defects in the semiconductor layer 122, in the semiconductor layer 124, at the interface between the insulating film 126 serving as a gate insulating film and the semiconductor layer 122, and at the interface between the insulating film 126 serving as a gate insulating film and the semiconductor layer 124 can be effectively reduced.

Figure 6D:
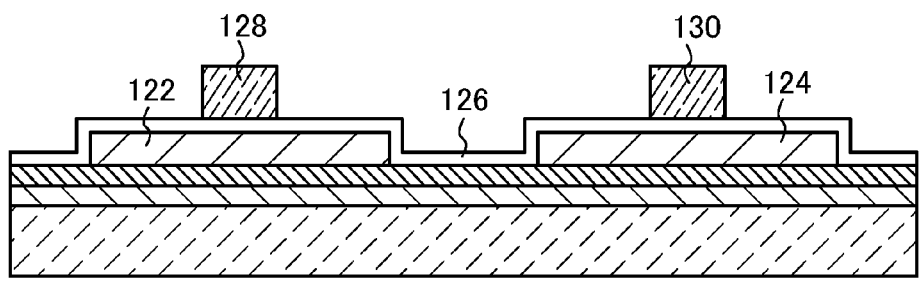

Next, a conductive film is formed over the insulating film 126, and then, the conductive film is processed (patterned) into a predetermined shape, so that a gate electrode 128 and a gate electrode 130 are formed over the semiconductor layer 122 and the semiconductor layer 124, respectively (see FIG. 6D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). An alloy material containing the above-described metal as its main component or a compound containing the above-described metal may also be used. Further, a semiconductor material such as polycrystalline silicon which is obtained by doping a semiconductor with an impurity element that imparts a conductivity type may also be used.

Although the electrodes 128 and 130 are each formed using a single-layer conductive film in this embodiment, a semiconductor device according to one embodiment of the present invention is not limited to this structure. The gate electrode 128, 130 may be formed of a plurality of conductive films which are stacked. In the case of a two-layer structure, for example, a molybdenum film, a titanium film, a titanium nitride film, or the like may be used as the lower layer, and an aluminum film or the like may be used as the upper layer. In the case of a three-layer structure, a stacked-layer structure of a molybdenum film, an aluminum film, and a molybdenum film; a stacked-layer structure of a titanium film, an aluminum film, and a titanium film; or the like may be used.

A mask used for forming the gate electrodes 128 and 130 may be formed using a material such as silicon oxide or silicon nitride oxide. In that case, a step of forming the mask by patterning a silicon oxide film, a silicon nitride oxide film, or the like is involved; however, decrease in film thickness of the mask in etching is smaller than that in the case of using a resist mask; thus, the electrodes 128 and 130 can be formed to have more precise shapes. Alternatively, the gate electrodes 128 and 130 may be selectively formed by a droplet discharge method without using a mask. The droplet discharge method refers to a method in which droplets containing a predetermined composition are discharged or ejected to form a pattern, and includes an ink jet method and the like in its category.

The gate electrodes 128 and 130 can also be formed by etching the conductive film to have tapered shapes by an inductively coupled plasma (ICP) etching method with appropriate etching conditions (e.g., the amount of electric power applied to a coiled electrode, the amount of electric power applied to a substrate-side electrode, the temperature of the substrate-side electrode, and the like). The tapered shape can also be adjusted by the shape of a mask. As an etching gas thereof, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 7A:
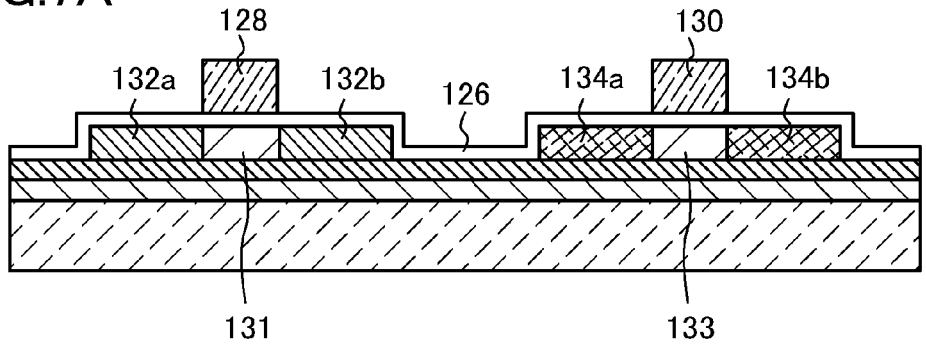
FIGS. 7A to 7D are cross-sectional views illustrating a manufacturing method of a semiconductor device.

Then, impurity elements each imparting one conductivity type are added into the semiconductor layers 122 and 124, using the gate electrodes 128 and 130 as masks, respectively (see FIG. 7A). In this embodiment, an impurity element imparting n-type conductivity (for example, phosphorus or arsenic) is added to the semiconductor layer 122, and an impurity element imparting p-type conductivity (for example, boron) is added to the semiconductor layer 124. When the impurity element imparting n-type conductivity is added to the semiconductor layer 122, the semiconductor layer 124 to which the impurity element imparting p-type conductivity is added is covered with a mask or the like so that the impurity element imparting n-type conductivity is added selectively. On the other hand, when the impurity element imparting p-type conductivity is added to the semiconductor layer 124, the semiconductor layer 122 to which the n-type impurity element is added is covered with a mask or the like so that the impurity element imparting p-type conductivity is added selectively. Alternatively, one of the impurity element imparting p-type conductivity and the impurity element imparting n-type conductivity may be added to the semiconductor layers 122 and 124, and then, the other of the impurity element imparting p-type conductivity and the impurity element imparting n-type conductivity may be added to only one of the semiconductor layers at a higher concentration. Through the above-described impurity addition, impurity regions 132a and 132b are formed in the semiconductor layer 122, and impurity regions 134a and 134b are formed in the semiconductor layer 124. In addition, a channel formation region 131 and a channel formation region 133 are formed between the impurity regions 132a and 132b and between the impurity regions 134a and 134b, respectively.

Figure 7B:
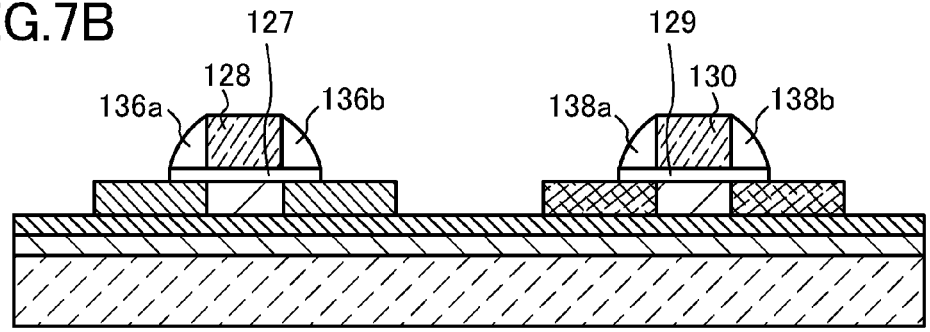

Then, sidewalls 136a and 136b are formed on sides of the gate electrode 128, and sidewalls 138a and 138b are formed on sides of the gate electrode 130 (see FIG. 7B). The sidewalls 136a, 136b, 138a, and 138b can be formed by, for example, forming an insulating film to cover the insulating film 126 and the gate electrodes 128 and 130, and then partly etching the insulating film by anisotropic etching. Further, with the anisotropic etching, the insulating film 126 is partly etched using the gate electrode 128 and the sidewalls 136a and 136b as a mask to form a gate insulating film 127; the insulating film 126 is partly etched using the gate electrode 130 and the sidewalls 138a and 138b as a mask to form a gate insulating film 129.

The insulating film used for forming the sidewalls 136a, 136b, 138a, and 138b can be formed using a film containing silicon, silicon oxide, silicon nitride, silicon oxynitride, silicon nitride oxide, an organic material, or the like with a single-layer structure or a stacked-layer structure by a plasma CVD method, a sputtering method, or the like. In this embodiment, a 100-nm-thick silicon oxide film is formed by a plasma CVD method. As an etching gas thereof, a mixed gas of $CHF_3$ and helium can be used. The process for forming the sidewalls 136a, 136b, 138a, and 138b is not limited thereto.

Then, an impurity element imparting one conductivity type is added into the semiconductor layer 122, using the gate insulating film 127, the gate electrode 128, and the sidewalls 136a and 136b as a mask; an impurity element imparting one conductivity type is added into the semiconductor layer 124, using the gate insulating film 129, the gate electrode 130, and the sidewalls 138a and 138b as a mask.

In that step, respective impurity elements imparting the same conductivity types as the impurity elements added to the semiconductor layers 122 and 124 in the previous step are added to the semiconductor layers 122 and 124 at higher concentrations than those in the previous step. Here, when the impurity element imparting n-type conductivity is added to the semiconductor layer 122, the semiconductor layer 124 to which the p-type impurity element is added is covered with a mask or the like so that the impurity element imparting n-type conductivity is added selectively. On the other hand, when the impurity element imparting p-type conductivity is added to the semiconductor layer 124, the semiconductor layer 122 to which the n-type impurity element is added is covered with a mask or the like so that the impurity element imparting p-type conductivity is added selectively.

Through the above-described impurity addition, a pair of high-concentration impurity regions 140a and 140b and a pair of low-concentration impurity regions 141a and 141b are formed in the semiconductor layer 122, and a pair of high-concentration impurity regions 142a and 142b and a pair of low-concentration impurity regions 143a and 143b are formed in the semiconductor layer 124. The pair of high-concentration impurity regions 140a and 140b functions as a source and drain regions, and the pair of high-concentration impurity regions 142a and 142b functions as a source and drain regions. The low-concentration impurity regions 141a, 141b, 143a, and 143b each function as an LDD (lightly doped drain) region.

The sidewalls 136a and 136b formed over the semiconductor layer 122 and the sidewalls 138a and 138b formed over the semiconductor layer 124 may be formed so as to have the same length in a direction where carriers move (the direction parallel to a so-called channel length), or may be formed so as to have different lengths. For example, the sidewalls 138a and 138b over the semiconductor layer 124 which constitutes part of a p-channel transistor 152 each are preferably formed to have a longer length in the direction in which carriers move than that of each of the sidewalls 136a and 136b over the semiconductor layer 122 which constitutes part of an n-channel transistor 151. By increasing the length of each of the sidewalls 138a and 138b of the p-channel transistor 152, a short channel effect due to diffusion of boron can be suppressed; thus, boron can be added to the source and drain regions at a high concentration. Accordingly, the resistance of the source and drain regions can be sufficiently reduced.

A silicide region where silicide is formed using part of the semiconductor layer 122, 124 may be formed in order to further reduce the resistance of the source and drain regions. The silicide is formed by making a metal in contact with the semiconductor layer and performing heat treatment (e.g., a GRTA method, an LRTA method, or the like) thereon to react the metal with silicon in the semiconductor layer. For the silicide region, cobalt silicide, nickel silicide, or the like may be used. In the case where the semiconductor layer 122, 124 is thin, the silicide reaction may be performed down to the bottom of the semiconductor layer 122, 124. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. The silicide region can also be formed by laser light irradiation or the like.

Figure 7C:
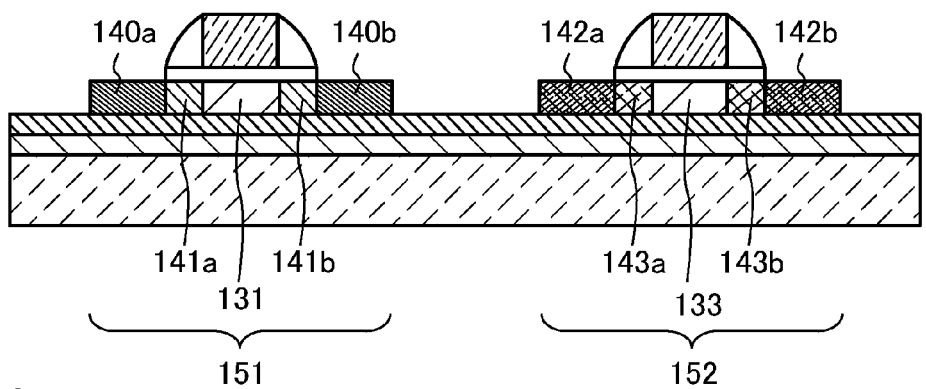

Through the above process, the n-channel transistor 151 and the p-channel transistor 152 are formed. Although a conductive film serving as a source electrode or a drain electrode is not formed in the step shown in FIG. 7C, a structure including the conductive film serving as a source electrode or a drain electrode may also be referred to as a transistor.

Next, an insulating film 145 is formed so as to cover the n-channel transistor 151 and the p-channel transistor 152. The insulating film 145 is not necessarily provided; however, the insulating film 145 can prevent impurities such as an alkali metal and an alkaline-earth metal from entering the n-channel transistor 151 and the p-channel transistor 152. Specifically, the insulating film 145 is preferably formed using silicon oxide, silicon nitride, silicon oxynitride, silicon nitride oxide, aluminum nitride, aluminum oxide, or the like. In this embodiment, a silicon nitride oxide film with a thickness of about 600 nm is used as the insulating film 145. In that case, the above-described hydrogenation step may be performed after the silicon nitride oxide film is formed. Although the insulating film 145 has a single-layer structure in this embodiment, the insulating film 145 may have a stacked-layer structure. For example, in the case of a two-layer structure, a stacked-layer structure of a silicon oxynitride film and a silicon nitride oxide film can be employed.

Figure 7D:
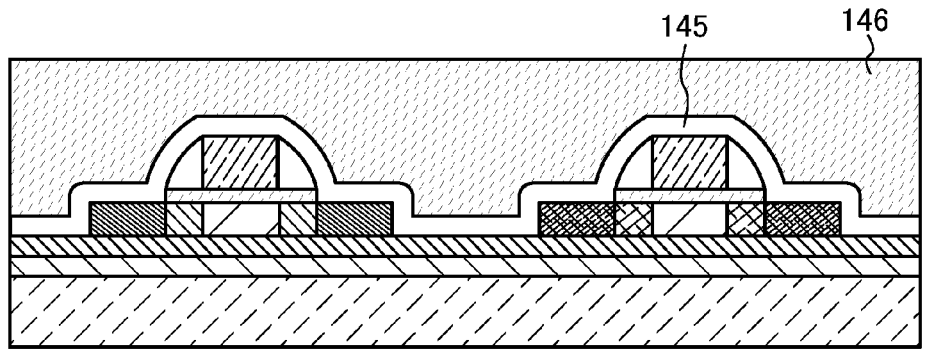

Next, an insulating film 146 is formed over the insulating film 145 to cover the n-channel transistor 151 and the p-channel transistor 152 (see FIG. 7D). The insulating film 146 may be formed using an organic material having heat resistance, such as polyimide, acrylic, benzocyclobutene, polyamide, or epoxy. Other than such an organic material, it is also possible to use a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, or aromatic hydrocarbon as a substituent. Insulating films formed of these materials may be stacked to form the insulating film 146.

The insulating film 146 can be formed by a CVD method, a sputtering method, an SOG method, a spin coating method, a dipping method, spray coating, a droplet discharge method (e.g., an inkjet method, screen printing, or offset printing), a doctor knife, a roll coater, a curtain coater, a knife coater, or the like.

Figure 8:
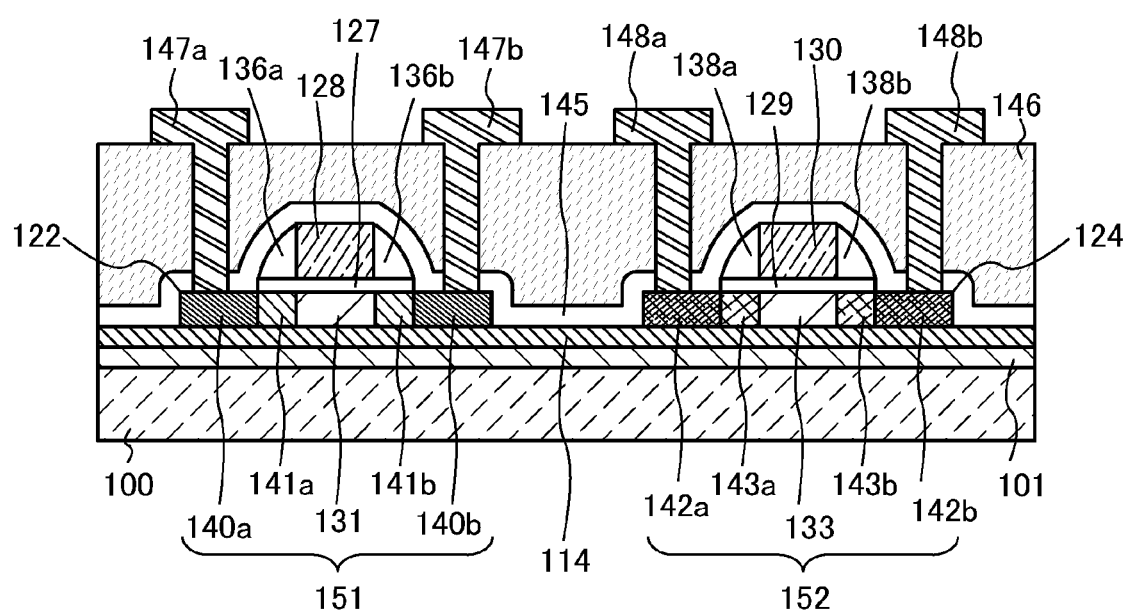
FIG. 8 is a cross-sectional view illustrating a manufacturing method of a semiconductor device.

Next, contact holes are formed in the insulating films 145 and 146 so that each of the semiconductor layers 122 and 124 is partly exposed. Then, conductive films 147a and 147b which are in contact with the semiconductor layer 122 through the contact holes, and conductive films 148a and 148b which are in contact with the semiconductor layer 124 through the contact holes are formed (see FIG. 8). The conductive films 147a, 147b, 148a, and 148b each function as a source electrode or a drain electrode. In this embodiment, a mixed gas of $CHF_3$ and He is employed as an etching gas for forming the contact holes; however, one embodiment of the present invention is not limited thereto.

The conductive films 147a, 147b, 148a, and 148b can be formed by a CVD method, a sputtering method, or the like. As a material of each conductive film, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. An alloy containing the above-described material as its main component or a compound containing the above-described material may also be used. The conductive films 147a, 147b, 148a, and 148b each can employ a single-layer structure or a stacked-layer structure.

As an example of the alloy containing aluminum as its main component, an alloy containing aluminum as its main component and also containing nickel can be given. In addition, an alloy containing aluminum as its main component and also containing nickel and one or both of carbon and silicon can also be given as an example thereof. Aluminum and aluminum silicon (Al—Si), which have low resistance and are inexpensive, are each suitable as a material for forming the conductive films 147a, 147b, 148a, and 148b. In particular, aluminum silicon is preferable because a hillock can be prevented from generating due to resist baking at the time of patterning. Further, a material in which copper (Cu) is mixed into aluminum at about 0.5% may be used instead of silicon.

In the case where each of the conductive films 147a, 147b, 148a, and 148b is formed to have a stacked-layer structure, a stacked-layer structure of a barrier film, an aluminum silicon film, and a barrier film, a stacked-layer structure of a barrier film, an aluminum silicon film, a titanium nitride film, and a barrier film, or the like may be employed, for example. The barrier film is a film formed using titanium, titanium nitride, molybdenum, molybdenum nitride, tantalum, tantalum nitride, or the like. By forming the conductive film such that an aluminum silicon film is positioned between barrier films, generation of hillocks of aluminum or aluminum silicon can be further prevented. Further, the barrier film may be formed using titanium that is a high reducing element, so that titanium contained in the barrier film can reduce a natural oxide film which may be formed on the semiconductor layer 122, 124, whereby improving the contact between the conductive film 147a, 147b and the semiconductor layer 122 and the contact between the conductive film 148a, 148b and the semiconductor layer 124. Further, it is also possible to stack a plurality of barrier films. In that case, for example, each of the conductive films 147a, 147b, 148a, and 148b can be formed to have a five-layer structure of titanium, titanium nitride, aluminum silicon, titanium, and titanium nitride in order from the bottom or a stacked-layer structure of more than five layers.

Further, as the conductive films 147a, 147b, 148a, and 148b, tungsten silicide formed by a chemical vapor deposition method using a $WF_6$ gas and a $SiH_4$ gas may also be used. Alternatively, tungsten formed by hydrogen reduction of $WF_6$ may be used as the conductive films 147a, 147b, 148a, and 148b.

The conductive films 147a and 147b are connected to the high-concentration impurity regions 140a and 140b of the n-channel transistor 151, respectively. The conductive films 148a and 148b are connected to the high-concentration impurity regions 142a and 142b of the p-channel transistor 152, respectively.

Although the n-channel transistor 151 includes one gate electrode 128 and the p-channel transistor 152 includes one gate electrode 130 in this embodiment, one embodiment of the present invention is not limited thereto. A transistor having a multi-gate structure in which a plurality of electrodes serving as gate electrodes are electrically connected to one another may be formed.

The structure described in this embodiment can be used in appropriate combination with any structure described in other embodiments.

According to this embodiment, a semiconductor device having a semiconductor layer whose thickness is even can be obtained.

It is preferable to use the semiconductor layer whose thickness is even obtained according to this embodiment because the reliability of a semiconductor element (e.g., a transistor) is increased.

This application is based on Japanese Patent Application serial no. 2011-001616 filed with Japan Patent Office on Jan. 7, 2011, the entire contents of which are hereby incorporated by reference.

What is claimed is:

1. A method for manufacturing an SOI substrate, comprising the steps of:
    polishing a first surface of a semiconductor substrate;
    forming an embrittled region in the semiconductor substrate by irradiating a second surface of the semiconductor substrate which is opposite to the first surface with ions;
    attaching the semiconductor substrate to a base substrate while the second surface of the semiconductor substrate faces the base substrate;
    forming a semiconductor layer over the base substrate by separating a part of the semiconductor substrate from the rest of the semiconductor substrate along the embrittled region; and
    thinning the semiconductor layer by etching,
    wherein the step of polishing the first surface of the semiconductor substrate is performed by performing chemical mechanical polishing using a first slurry on the first surface of the semiconductor substrate and then performing chemical mechanical polishing using a second slurry on the first surface of the semiconductor substrate, and wherein the step of polishing the first surface of the semiconductor substrate is performed before the step of forming the embrittled region in the semiconductor substrate.

2. The method for manufacturing an SOI substrate, according to claim 1,
wherein σ denotes a standard deviation of a thickness of the semiconductor layer, and
wherein 3σ is less than or equal to 1.5 nm.

3. The method for manufacturing an SOI substrate, according to claim 1, wherein the first surface of the semiconductor substrate is planarized by the step of polishing.

4. The method for manufacturing an SOI substrate, according to claim 1, wherein the semiconductor substrate and the base substrate are heated in the separation of the semiconductor layer.

5. The method for manufacturing an SOI substrate, according to claim 1, wherein the step of polishing is performed by mechanical polishing or chemical mechanical polishing.

6. The method for manufacturing an SOI substrate, according to claim 1, wherein a source gas of the ions is a gas containing hydrogen.

7. A method for manufacturing an SOI substrate, comprising the steps of:
polishing a first surface of a semiconductor substrate;
forming a first insulating layer on the semiconductor substrate;
forming an embrittled region in the semiconductor substrate by irradiating a second surface of the semiconductor substrate which is opposite to the first surface with ions;
forming a second insulating layer over a base substrate;
attaching the semiconductor substrate to the base substrate with the first insulating layer and the second insulating layer interposed between the semiconductor substrate and the base substrate;
forming a semiconductor layer over the base substrate by separating a part of the semiconductor substrate from the rest of the semiconductor substrate along the embrittled region; and
thinning the semiconductor layer by etching,
wherein the step of polishing the first surface of the semiconductor substrate is performed by performing chemical mechanical polishing using a first slurry on the first surface of the semiconductor substrate and then performing chemical mechanical polishing using a second slurry on the first surface of the semiconductor substrate, and
wherein the step of polishing the first surface of the semiconductor substrate is performed before the step of forming the embrittled region in the semiconductor substrate.

8. The method for manufacturing an SOI substrate, according to claim 7,
wherein σ denotes a standard deviation of a thickness of the semiconductor layer, and
wherein 3σ is less than or equal to 1.5 nm.

9. The method for manufacturing an SOI substrate, according to claim 7, wherein the first surface of the semiconductor substrate is planarized by the step of polishing.

10. The method for manufacturing an SOI substrate, according to claim 7, wherein the semiconductor substrate and the base substrate are heated in the separation of the semiconductor layer.

11. The method for manufacturing an SOI substrate, according to claim 7, wherein the step of polishing is performed by mechanical polishing or chemical mechanical polishing.

12. The method for manufacturing an SOI substrate, according to claim 7, wherein a source gas of the ions is a gas containing hydrogen.

* * * * *